(12) United States Patent
Chae et al.

(10) Patent No.: US 9,972,740 B2
(45) Date of Patent: May 15, 2018

(54) CHEMICAL VAPOR DEPOSITION TOOL AND PROCESS FOR FABRICATION OF PHOTOVOLTAIC STRUCTURES

(71) Applicant: SolarCity Corporation, San Mateo, CA (US)

(72) Inventors: Yongkee Chae, San Ramon, CA (US); Jianming Fu, Palo Alto, CA (US)

(73) Assignee: TESLA, INC., Palo Alto, CA (US)

( * ) Notice: Subject to any disclaimer, the term of this patent is extended or adjusted under 35 U.S.C. 154(b) by 38 days.

(21) Appl. No.: 14/985,143

(22) Filed: Dec. 30, 2015

(65) Prior Publication Data

US 2016/0359071 A1 Dec. 8, 2016

Related U.S. Application Data

(60) Provisional application No. 62/172,229, filed on Jun. 7, 2015.

(51) Int. Cl.
*H01L 21/00* (2006.01)
*H01L 31/18* (2006.01)
(Continued)

(52) U.S. Cl.
CPC ........ *H01L 31/1868* (2013.01); *C23C 16/455* (2013.01); *H01L 21/67161* (2013.01);
(Continued)

(58) Field of Classification Search
CPC ........ H01L 21/67161; H01L 21/67173; H01L 31/02167; H01L 31/022425;
(Continued)

(56) References Cited

U.S. PATENT DOCUMENTS 3,603,284 A 9/1971 Garnache
3,637,434 A 1/1972 Nakanuma
(Continued)

FOREIGN PATENT DOCUMENTS

CN 101263590 9/2008
CN 102559134 7/2012
(Continued)

OTHER PUBLICATIONS

"Pad printing as a film forming technique for polymer solar cells" Krebs, F.C.
(Continued)

*Primary Examiner* — Duy T Nguyen
(74) *Attorney, Agent, or Firm* — Shun Yao; Park, Vaughan, Fleming & Dowler LLP

(57) ABSTRACT

One embodiment of the present invention can provide a system for fabricating a photovoltaic structure. During fabrication, the system can deposit a first passivation layer on a first side of a Si base layer of the photovoltaic structure using a static chemical vapor deposition process. The static chemical vapor deposition process can be performed inside a first reaction chamber. The system can then transfer the photovoltaic structure from the first reaction chamber to a second reaction chamber without the photovoltaic structure leaving a common vacuum space comprising both reaction chambers, and deposit a second passivation layer on the first passivation layer using an inline chemical vapor deposition process. The inline chemical vapor deposition process can be performed inside the second reaction chamber.

13 Claims, 7 Drawing Sheets

(51) Int. Cl.
  *C23C 16/455* (2006.01)
  *H01L 31/0216* (2014.01)
  *H01L 31/0224* (2006.01)
  *H01L 31/028* (2006.01)
  *H01L 31/0352* (2006.01)
  *H01L 31/0376* (2006.01)
  *H01L 31/074* (2012.01)
  *H01L 31/20* (2006.01)
  *H01L 21/67* (2006.01)

(52) U.S. Cl.
  CPC ...... *H01L 21/67173* (2013.01); *H01L 31/028* (2013.01); *H01L 31/02167* (2013.01); *H01L 31/022425* (2013.01); *H01L 31/022466* (2013.01); *H01L 31/03529* (2013.01); *H01L 31/03762* (2013.01); *H01L 31/074* (2013.01); *H01L 31/1804* (2013.01); *H01L 31/202* (2013.01); *Y02E 10/547* (2013.01); *Y02P 70/521* (2015.11)

(58) Field of Classification Search
  CPC ........... H01L 31/022466; H01L 31/028; H01L 31/03529; H01L 31/03762; H01L 31/074; H01L 31/1804; H01L 31/1868; H01L 31/202; Y02E 10/547
  USPC ...................................................... 438/48, 57
  See application file for complete search history.

(56) References Cited

U.S. PATENT DOCUMENTS

| | | |
|---|---|---|
| 3,658,585 A | 4/1972 | Folkmann |
| 3,675,619 A | 7/1972 | Burd |
| 3,699,298 A | 10/1972 | Briody |
| 3,796,182 A | 3/1974 | Rosler |
| 3,806,360 A | 4/1974 | Briody |
| 4,154,998 A | 5/1979 | Luft |
| 4,168,998 A | 9/1979 | Hasegawa |
| 4,193,756 A | 3/1980 | Leon |
| 4,268,374 A | 5/1981 | Lepselter |
| 4,298,443 A | 11/1981 | Maydan |
| 4,325,778 A | 4/1982 | Lepselter |
| 4,355,974 A | 10/1982 | Lee |
| 4,496,828 A | 1/1985 | Kusmierz |
| 4,522,149 A | 6/1985 | Garbis |
| 4,558,660 A | 12/1985 | Nishizawa |
| 4,565,157 A | 1/1986 | Brors |
| 4,579,080 A | 4/1986 | Martin |
| 4,612,207 A | 9/1986 | Jansen |
| 4,661,199 A | 4/1987 | Looney |
| 4,668,484 A | 5/1987 | Elliott |
| 4,747,367 A | 5/1988 | Posa |
| 4,761,044 A | 8/1988 | Akama |
| 4,761,269 A | 8/1988 | Conger |
| 4,786,352 A | 11/1988 | Benzing |
| 4,794,220 A | 12/1988 | Sekiya |
| 4,807,562 A | 2/1989 | Sandys |
| 4,823,736 A | 4/1989 | Post |
| 4,838,983 A | 6/1989 | Schumaker |
| 4,839,145 A | 6/1989 | Gale |
| 4,858,558 A | 8/1989 | Ohmura |
| 4,867,629 A | 9/1989 | Iwasawa |
| 4,928,626 A | 5/1990 | Carlson |
| 4,967,645 A | 11/1990 | Mattson |
| 4,993,559 A | 2/1991 | Cota |
| 5,038,711 A | 8/1991 | Dan |
| 5,053,247 A | 10/1991 | Moore |
| 5,074,245 A | 12/1991 | Ota |
| 5,119,540 A | 6/1992 | Kong |
| 5,121,531 A | 6/1992 | Severns |
| 5,151,133 A | 9/1992 | Ohmine |
| 5,207,835 A | 5/1993 | Moore |
| 5,269,847 A | 12/1993 | Anderson |
| 5,288,364 A | 2/1994 | Burt |
| 5,350,455 A | 9/1994 | Mahler |
| 5,351,415 A | 10/1994 | Brooks |
| 5,373,806 A | 12/1994 | Logar |
| 5,374,159 A | 12/1994 | Severns |
| 5,427,824 A | 6/1995 | Inushima |
| 5,441,571 A | 8/1995 | Ohta |
| 5,452,795 A | 9/1995 | Gallagher |
| 5,453,124 A | 9/1995 | Moslehi |
| 5,458,918 A | 10/1995 | Hawkins |
| 5,476,359 A | 12/1995 | Severns |
| 5,505,778 A | 4/1996 | Ono |
| 5,518,549 A | 5/1996 | Hellwig |
| 5,532,190 A | 7/1996 | Goodyear |
| 5,614,447 A | 3/1997 | Yamaga |
| 5,629,245 A | 5/1997 | Inushima |
| 5,700,422 A | 12/1997 | Usui |
| 5,785,186 A | 7/1998 | Babbs |
| H1762 H | 12/1998 | Kaempf |
| 5,871,586 A | 2/1999 | Crawley |
| 5,916,369 A | 6/1999 | Anderson |
| 5,950,925 A | 9/1999 | Fukunaga |
| 5,960,960 A | 10/1999 | Yamamoto |
| 5,964,948 A | 10/1999 | Dietze |
| 5,993,555 A | 11/1999 | Hamilton |
| 5,994,675 A | 11/1999 | Bethune |
| 6,013,338 A | 1/2000 | Inushima |
| 6,077,722 A | 6/2000 | Jansen |
| 6,098,808 A | 8/2000 | Matsuda |
| 6,110,289 A | 8/2000 | Moore |
| 6,113,984 A | 9/2000 | MacLeish |
| 6,120,605 A | 9/2000 | Sato |
| 6,122,566 A | 9/2000 | Nguyen |
| 6,129,048 A | 10/2000 | Sullivan |
| 6,152,680 A | 11/2000 | Howells |
| 6,193,804 B1 | 2/2001 | Chang |
| 6,214,116 B1 | 4/2001 | Shin |
| 6,217,662 B1 | 4/2001 | Kong |
| 6,262,393 B1 | 7/2001 | Imai |
| 6,328,169 B1 | 12/2001 | Matsuda |
| 6,338,756 B2 | 1/2002 | Dietze |
| 6,348,397 B2 | 2/2002 | Ide |
| 6,370,791 B1 | 4/2002 | Weaver |
| 6,399,510 B1 | 6/2002 | Riley |
| 6,435,428 B2 | 8/2002 | Kim |
| 6,472,284 B2 | 10/2002 | Kim |
| 6,472,639 B2 | 10/2002 | Nishitani |
| 6,478,923 B1 | 11/2002 | Igarashi |
| 6,500,734 B2 | 12/2002 | Anderson |
| 6,506,256 B2 | 1/2003 | Ide |
| 6,530,990 B2 | 3/2003 | Kong |
| 6,544,333 B2 | 4/2003 | Keck |
| 6,562,128 B1 | 5/2003 | Dietze |
| 6,586,270 B2 | 7/2003 | Tsuzuki et al. |
| 6,637,988 B1 | 10/2003 | Park |
| 6,679,672 B1 | 1/2004 | Barrows |
| 6,716,027 B2 | 4/2004 | Kim |
| 6,747,249 B2 | 6/2004 | Robinson |
| 6,808,352 B2 | 10/2004 | Seita |
| 6,814,811 B2 | 11/2004 | Ose |
| 6,916,399 B1 | 7/2005 | Rozenzon |
| 6,923,325 B2 | 8/2005 | Duban-Hu |
| 6,934,145 B2 | 8/2005 | Hsieh |
| 6,948,623 B2 | 9/2005 | Takano |
| 6,959,823 B2 | 11/2005 | Jun |
| 7,153,368 B2 | 12/2006 | Preti |
| 7,159,537 B2 | 1/2007 | Wickramanayaka |
| 7,225,934 B2 | 6/2007 | Shon |
| 7,270,713 B2 | 9/2007 | Blonigan |
| 7,273,526 B2 | 9/2007 | Shinriki |
| 7,293,950 B2 | 11/2007 | Bonora |
| 7,313,452 B2 | 12/2007 | Kobayashi |
| 7,314,526 B1 | 1/2008 | Preti |
| 7,354,622 B2 | 4/2008 | Shinriki |
| 7,357,842 B2 | 4/2008 | Ishikawa |
| 7,410,340 B2 | 8/2008 | Bonora |
| 7,442,562 B2 | 10/2008 | Onishi |
| 7,462,246 B2 | 12/2008 | Hellwig |
| 7,628,863 B2 | 12/2009 | Sen |

(56) References Cited

U.S. PATENT DOCUMENTS

| | | |
|---|---|---|
| 7,819,261 B2 | 10/2010 | Mayuzumi |
| 7,897,525 B2 | 3/2011 | Lei |
| 7,900,776 B2 | 3/2011 | Burns |
| 7,918,938 B2 | 4/2011 | Provencher |
| 7,988,399 B2 | 8/2011 | vanderMeulen |
| 7,989,729 B1 | 8/2011 | Zhao |
| 8,034,667 B2 | 10/2011 | Shinoda |
| 8,080,107 B2 | 12/2011 | Kennedy |
| 8,110,511 B2 | 2/2012 | Lei |
| 8,133,323 B2 | 3/2012 | Kakegawa |
| 8,173,473 B2 | 5/2012 | Aqui |
| 8,183,132 B2 | 5/2012 | Nijhawan |
| 8,231,799 B2 | 7/2012 | Bera |
| 8,246,284 B2 | 8/2012 | Borden |
| 8,257,547 B2 | 9/2012 | Pei |
| 8,268,078 B2 | 9/2012 | Suzuki |
| 8,268,734 B2 | 9/2012 | Lei |
| 8,288,645 B2 | 10/2012 | Lee |
| 8,367,565 B2 | 2/2013 | Lei |
| 8,388,753 B2 | 3/2013 | Pei |
| 8,404,049 B2 | 3/2013 | Hellwig |
| 8,430,962 B2 | 4/2013 | Masuda |
| 8,435,424 B2 | 5/2013 | Hsu |
| 8,448,598 B2 | 5/2013 | Pei |
| 8,481,844 B2 | 7/2013 | Nishida |
| 8,500,388 B2 | 8/2013 | vanderMeulen |
| 8,528,750 B2 | 9/2013 | Heo |
| 8,539,908 B2 | 9/2013 | Takagi |
| 8,562,745 B2 | 10/2013 | Rozenzon |
| 8,563,998 B2 | 10/2013 | Wegleiter |
| 8,608,854 B2 | 12/2013 | Pei |
| 8,686,283 B2 | 4/2014 | Heng |
| 8,691,620 B2 | 4/2014 | Lee |
| 8,764,902 B2 | 7/2014 | Suzuki |
| 8,778,079 B2 | 7/2014 | Begarney |
| 8,808,454 B2 | 8/2014 | Lee |
| 8,877,000 B2 | 11/2014 | Strang |
| 8,898,930 B2 | 12/2014 | Godot |
| 8,967,081 B2 | 3/2015 | Borean |
| 8,980,005 B2 | 3/2015 | Carlson |
| 9,022,714 B2 | 5/2015 | Lee |
| 9,105,673 B2 | 8/2015 | Babbs |
| 9,117,670 B2 | 8/2015 | Abedijaberi |
| 9,147,788 B2 | 9/2015 | DeGroot |
| 9,159,864 B2 | 10/2015 | Lucas |
| 9,205,505 B2 | 12/2015 | Sridharan |
| 2001/0040100 A1 | 11/2001 | Wang |
| 2002/0004309 A1 | 1/2002 | Collins |
| 2002/0102859 A1 | 8/2002 | Yoo |
| 2003/0012885 A1 | 1/2003 | Gramarossa |
| 2003/0019428 A1 | 1/2003 | Ku |
| 2003/0145791 A1 | 8/2003 | Shinya |
| 2004/0135979 A1 | 7/2004 | Hazelton |
| 2005/0016956 A1 | 1/2005 | Liu |
| 2005/0105991 A1 | 5/2005 | Hofmeister |
| 2005/0199279 A1 | 9/2005 | Yoshimine |
| 2005/0208217 A1 | 9/2005 | Shinriki |
| 2005/0226794 A1 | 10/2005 | Hodge |
| 2005/0229848 A1 | 10/2005 | Shinriki |
| 2006/0006559 A1 | 1/2006 | Nakagawa |
| 2006/0016559 A1 | 1/2006 | Kobayashi |
| 2006/0060791 A1 | 3/2006 | Hazelton |
| 2006/0124169 A1 | 6/2006 | Mizusawa |
| 2006/0156970 A1 | 7/2006 | Dong-Suk |
| 2006/0191118 A1 | 8/2006 | Lee |
| 2006/0191637 A1 | 8/2006 | Zajac |
| 2006/0201414 A1 | 9/2006 | Brabant |
| 2006/0231035 A1 | 10/2006 | Hellwig |
| 2007/0011863 A1 | 1/2007 | Yoshikawa |
| 2007/0051314 A1 | 3/2007 | Choi |
| 2007/0131173 A1 | 6/2007 | Halpin |
| 2007/0175391 A1 | 8/2007 | Mizusawa |
| 2007/0181181 A1 | 8/2007 | Mizusawa |
| 2007/0247075 A1 | 10/2007 | Kim |
| 2007/0249173 A1 | 10/2007 | Kim |
| 2007/0251642 A1 | 11/2007 | Bera |
| 2007/0254483 A1 | 11/2007 | Bera |
| 2007/0254486 A1 | 11/2007 | Bera |
| 2008/0000851 A1 | 1/2008 | Pickering |
| 2008/0092944 A1 | 4/2008 | Rubin |
| 2008/0176289 A1 | 7/2008 | Zeng |
| 2008/0196757 A1 | 8/2008 | Yoshimine |
| 2008/0276451 A1 | 11/2008 | Morad |
| 2009/0014746 A1 | 1/2009 | Gweneth |
| 2009/0067957 A1 | 3/2009 | Ando |
| 2009/0081878 A1 | 3/2009 | Dhindsa |
| 2009/0117746 A1 | 5/2009 | Masuda |
| 2009/0139570 A1 | 6/2009 | Kinoshita |
| 2009/0194235 A1 | 8/2009 | Kobayashi |
| 2009/0311869 A1 | 12/2009 | Okesaku |
| 2010/0009489 A1 | 1/2010 | Tu |
| 2010/0029067 A1 | 2/2010 | Vijh |
| 2010/0047954 A1 | 2/2010 | Su |
| 2010/0092697 A1 | 4/2010 | Poppe |
| 2010/0092698 A1 | 4/2010 | Poppe |
| 2010/0096003 A1 | 4/2010 | Hobbie |
| 2010/0132778 A1 | 6/2010 | Hong |
| 2010/0162954 A1 | 7/2010 | Lei |
| 2010/0166980 A1* | 7/2010 | Kawata ............... C23C 16/52 427/569 |
| 2010/0167503 A1 | 7/2010 | Lei |
| 2010/0171215 A1 | 7/2010 | Fischer |
| 2010/0173439 A1 | 7/2010 | Lei |
| 2010/0183825 A1 | 7/2010 | Becker |
| 2010/0263587 A1 | 10/2010 | Sivaramakrishnan |
| 2010/0273279 A1 | 10/2010 | Su |
| 2010/0282272 A1 | 11/2010 | Godot |
| 2010/0300506 A1 | 12/2010 | Yu |
| 2010/0313877 A1 | 12/2010 | Bellman |
| 2011/0033638 A1 | 2/2011 | Ponnekanti |
| 2011/0033957 A1 | 2/2011 | Holden |
| 2011/0048325 A1 | 3/2011 | Choi |
| 2011/0067632 A1 | 3/2011 | Poppe |
| 2011/0140246 A1 | 6/2011 | Hoenk |
| 2011/0151119 A1 | 6/2011 | Lei |
| 2011/0177627 A1 | 7/2011 | Huegli |
| 2011/0180402 A1* | 7/2011 | Kurata ............... C23C 14/568 204/298.23 |
| 2011/0217469 A1 | 9/2011 | Lei |
| 2011/0245957 A1 | 10/2011 | Porthouse |
| 2011/0262252 A1 | 10/2011 | Lee |
| 2011/0262628 A1 | 10/2011 | Sferlazzo |
| 2011/0263070 A1 | 10/2011 | Schaeffer |
| 2011/0277688 A1 | 11/2011 | Trujillo |
| 2011/0277690 A1 | 11/2011 | Rozenzon |
| 2011/0283941 A1 | 11/2011 | Rozenzon |
| 2011/0285840 A1 | 11/2011 | Benson |
| 2012/0076936 A1 | 3/2012 | Hirano |
| 2012/0111271 A1 | 5/2012 | Begarney |
| 2012/0125391 A1 | 5/2012 | Pinarbasi |
| 2012/0315395 A1 | 12/2012 | Kuribe |
| 2012/0318340 A1 | 12/2012 | Borden |
| 2013/0171757 A1 | 7/2013 | Ponnekanti |
| 2013/0269602 A1 | 10/2013 | Miyamoto |
| 2014/0060633 A1 | 3/2014 | Lucas |
| 2014/0086720 A1 | 3/2014 | Kao |
| 2014/0124013 A1 | 5/2014 | Morad et al. |
| 2014/0124713 A1 | 5/2014 | Majumdar |
| 2014/0213016 A1 | 7/2014 | Sheng |
| 2014/0287159 A1 | 9/2014 | Carmody |
| 2014/0299256 A1 | 10/2014 | Sridharan |
| 2015/0068587 A1 | 3/2015 | Lomasney |
| 2015/0108107 A1 | 4/2015 | Liu |
| 2015/0194374 A1 | 7/2015 | Ananiev |
| 2015/0206780 A1 | 7/2015 | Choi |
| 2015/0303079 A1 | 10/2015 | Oosterlaken |
| 2015/0349703 A1 | 12/2015 | Morad |
| 2015/0364356 A1 | 12/2015 | Moore |
| 2016/0009958 A1 | 1/2016 | Moore |

FOREIGN PATENT DOCUMENTS

| | | |
|---|---|---|
| CN | 102800746 | 11/2012 |
| CN | 103943727 | 7/2014 |

(56) References Cited

FOREIGN PATENT DOCUMENTS

| | | |
|---|---|---|
| CN | 104040732 | 9/2014 |
| CN | 103000253 | 5/2015 |
| CN | 104600158 | 5/2015 |
| CN | 105761778 | 7/2016 |
| DE | 3833703 | 5/1992 |
| EP | 2098609 | 9/2009 |
| EP | 2489759 | 8/2012 |
| JP | H071222622 | 5/1995 |
| JP | 07230942 | 8/1995 |
| JP | H07230942 | 8/1995 |
| JP | 11163089 | 6/1999 |
| JP | H11288890 A | 10/1999 |
| JP | 200068356 | 3/2000 |
| JP | 2000068356 | 3/2000 |
| JP | 2001284218 | 10/2001 |
| JP | 2002179207 | 6/2002 |
| JP | 2003158054 A | 5/2003 |
| JP | 2003277936 A | 10/2003 |
| JP | 2004296855 | 10/2004 |
| JP | 2006080098 A | 3/2006 |
| JP | 2007207762 | 8/2007 |
| JP | 2013033967 | 2/2013 |
| JP | 2013149596 | 8/2013 |
| JP | 2014007309 | 1/2014 |
| JP | 2014197592 | 10/2014 |
| KR | 20060117134 A | 11/2006 |
| KR | 1404986 | 6/2014 |
| KR | 20150137810 | 12/2015 |
| WO | 2011133965 | 10/1920 |
| WO | 0072362 | 11/2000 |
| WO | 2009029901 | 3/2009 |
| WO | 2009090172 | 7/2009 |
| WO | 2010129136 A2 | 11/2010 |
| WO | 2010129136 A3 | 11/2010 |
| WO | 2012128459 | 9/2012 |
| WO | 2012174432 | 12/2012 |
| WO | 2013124394 | 8/2013 |
| WO | 2014038277 | 3/2014 |
| WO | 2014045241 | 3/2014 |
| WO | 2014046810 | 3/2014 |
| WO | 2015163163 | 10/2015 |

OTHER PUBLICATIONS

"Thick-Film Materials for Silicon Photovoltaic Cell Manufacture" Field, M.B. Jan. 1997.

Beaucarne, G et al., "Epitaxial thin-film Si solar cells", pp. 533-542, Science Direct, www.sciencedirect.com, Thin Solid Films 511-512 (2006) 533-542.

Cebrian et al., "Paste Adhesive Modification for Induction Curing", Jan. 2012.

\* cited by examiner

CHEMICAL VAPOR DEPOSITION TOOL AND PROCESS FOR FABRICATION OF PHOTOVOLTAIC STRUCTURES

CROSS-REFERENCE TO OTHER APPLICATIONS

This application claims the benefit of U.S. Provisional Application No. 62/172,229, entitled "Chemical Vapor Deposition Tool and Process," by inventors Yongkee Chae and Jianming Fu, filed Jun. 7, 2015.

FIELD OF THE INVENTION

This is generally related to semiconductor device fabrication. More specifically, this is related to a chemical vapor deposition tool and process with improved throughput.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Large-scale production of high-efficiency solar cells plays an important role in ensuring the success of solar power over conventional energy sources that are based on fossil fuels. However, most of the current processes for manufacturing high-efficiency solar cells are not optimized for mass production. For example, many laboratory-made solar cells demonstrate superior performance, but the fabrication process for those solar cells cannot be applied in a mass production environment.

It has been shown that good passivation can be the key to ensuring high efficiency in solar cells. However, achieving good passivation under mass production conditions can be challenging. Conventional fabrication systems often have to sacrifice system throughput in order to meet the passivation requirement.

SUMMARY

One embodiment of the present invention can provide a system for fabricating a photovoltaic structure. During fabrication, the system can deposit a first passivation layer on a first side of a Si base layer of the photovoltaic structure using a static chemical vapor deposition process. The static chemical vapor deposition process can be performed inside a first reaction chamber. The system can then transfer the photovoltaic structure from the first reaction chamber to a second reaction chamber without the photovoltaic structure leaving a common vacuum space comprising both reaction chambers, and deposit a second passivation layer on the first passivation layer using an inline chemical vapor deposition process. The inline chemical vapor deposition process can be performed inside the second reaction chamber.

In a variation of this embodiment, the first passivation layer can include intrinsic hydrogenated amorphous Si having low hydrogen content.

In a further variation, depositing the first passivation layer can involve using silane gas as a precursor.

In a variation of this embodiment, the second passivation layer can include intrinsic hydrogenated amorphous Si having high hydrogen content.

In a further variation, depositing the second passivation layer can involve using silane gas and hydrogen gas as precursors.

In a variation of this embodiment, the photovoltaic structure can remain stationary during the static chemical vapor deposition process.

In a variation of this embodiment, the photovoltaic structure can continuously move through the second reaction chamber during the inline chemical vapor deposition process.

In a further variation, the second chamber can be configured to have a continuous flow of processing gases.

In a variation of this embodiment, transferring the photovoltaic structure from the first reaction chamber to the second reaction chamber can involve placing the photovoltaic structure into a buffer chamber prior to placing the photovoltaic structure into the second reaction chamber.

In a variation of this embodiment, the system can further form, using a wet oxidation process, a thin oxide layer positioned on both surfaces of the Si base layer.

In a variation of this embodiment, the system can further transfer the photovoltaic structure from the second reaction chamber to a third reaction chamber without the photovoltaic structure leaving the common vacuum space, and deposit a heavily doped amorphous Si layer on the second passivation layer using a second inline chemical vapor deposition process.

In a further variation, the heavily doped amorphous Si can be n-type doped, and the second inline chemical vapor deposition process can use silane gas, hydrogen gas, and phosphine gas as precursors.

In a further variation, the heavily doped amorphous Si can be p-type doped, and the second inline chemical vapor deposition process can use silane gas, hydrogen gas, and diborane gas as precursors.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention can provide a system and method for fabricating high-efficiency photovoltaic structures with high throughput. To ensure good passivation at the surface of the crystalline Si substrate, a thin layer of intrinsic hydrogenated amorphous Si (a-Si:H) having a low hydrogen (H) concentration is deposited onto the Si substrate followed by the deposition of a thin layer of intrinsic a-Si:H having a high H concentration. The initial low-H a-Si:H layer can ensure a lower surface defect density, and the high H concentration of the subsequent a-Si layer can provide a layer with a wide bandgap, which can be the key to good surface passivation.

Chemical vapor deposition (CVD) tools can often be used to deposit the passivation layers as well as heavily doped emitter and/or surface field layers. Some embodiments of the present invention can provide a novel CVD tool that is capable of meeting both the passivation and throughput requirements.

More specifically, the CVD tool can include at least a static chamber and an inline chamber. The initial a-Si passivation layer is deposited inside the static chamber to ensure a low-defect interface. The subsequent a-Si:H passivation layer is deposited inside the inline chamber to ensure high throughput. The Si substrates can be transported from the static chamber to the inline chamber without leaving a common vacuum space.

High-Efficiency Photovoltaic Structures and CVD Systems

Figure 1:
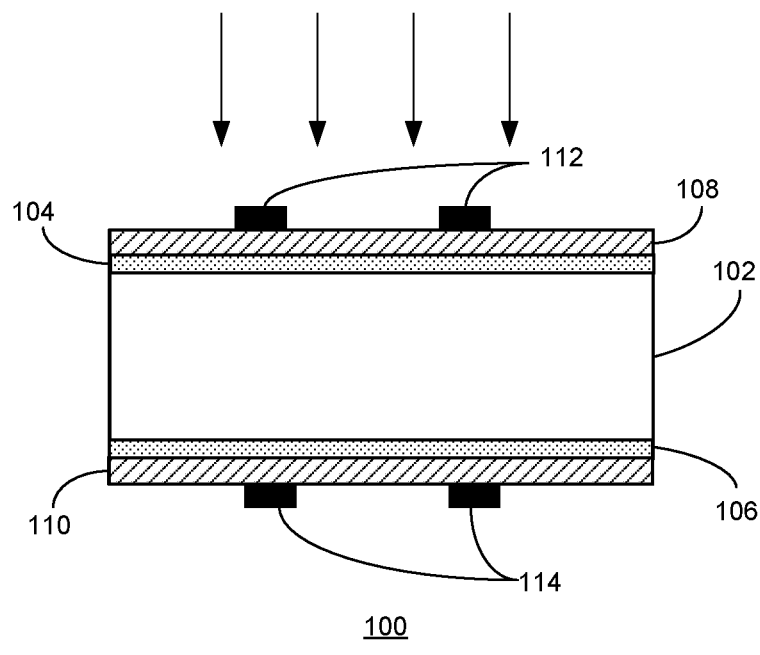
FIG. 1 shows an exemplary photovoltaic structure.

FIG. 1 shows an exemplary photovoltaic structure. In FIG. 1, photovoltaic structure 100 can include substrate 102, passivation layers 104 and 106, surface-field layer 108, emitter layer 110, and electrode grids 112 and 114. In the example shown in FIG. 1, substrate 102 can include a lightly doped or substantially intrinsic crystalline Si (c-Si) layer; passivation layers 104 and 106 can include wide bandgap materials (e.g., a-Si:H or $SiN_x$:H); surface-field layer 108 can include a heavily doped amorphous Si (a-Si) layer; and emitter layer 110 can include a heavily doped a-Si layer.

Also in FIG. 1, surface-field layer 108 can face the majority of incident light (as indicated by arrows), and hence can also be called the front surface-field (FSF) layer. Substrate 102 can either be doped with n-type dopants (e.g., phosphorus) or p-type dopants (e.g., boron). The doping types of FSF layer 108 and emitter layer 110 can be determined by the doping type of substrate 102. For an n-type doped substrate, FSF layer 108 can be doped with n-type dopants to act as an electron collector; and emitter layer 110 can be doped with p-type dopants to act as a hole collector.

As one can see from FIG. 1, photovoltaic structure 100 can include two junctions, a junction formed between FSF layer 108 and substrate 102 and a junction formed between emitter layer 110 and substrate 102. In order for photovoltaic structure 100 to have high efficiency, one must ensure that good passivation on both sides of substrate 102 can be achieved. Due to its wide bandgap and the ability to reduce the carrier recombination velocity, hydrogenated a-Si (a-Si:H) has been used for passivation purposes. The intrinsic a-Si:H typically can be deposited using a chemical vapor deposition (CVD) technique, such as a plasma-enhanced CVD (PECVD) technique.

A typical CVD process that deposits a-Si:H can use silane ($SiH_4$) and $H_2$ as precursors. A high flow rate of $H_2$ can increase the atomic H concentration in the formed a-Si:H, resulting in a wider bandgap of the deposited a-Si:H. The wider bandgap is a desirable quality for passivation purposes. However, experiments have shown that introducing additional $H_2$ flow during the CVD of the a-Si:H can cause the a-Si:H—Si interface to have a high interface defect density ($D_{it}$). This high $D_{it}$ can lead to increased carrier recombination at the Si surface, and hence can reduce the energy-conversion efficiency.

Figure 2:
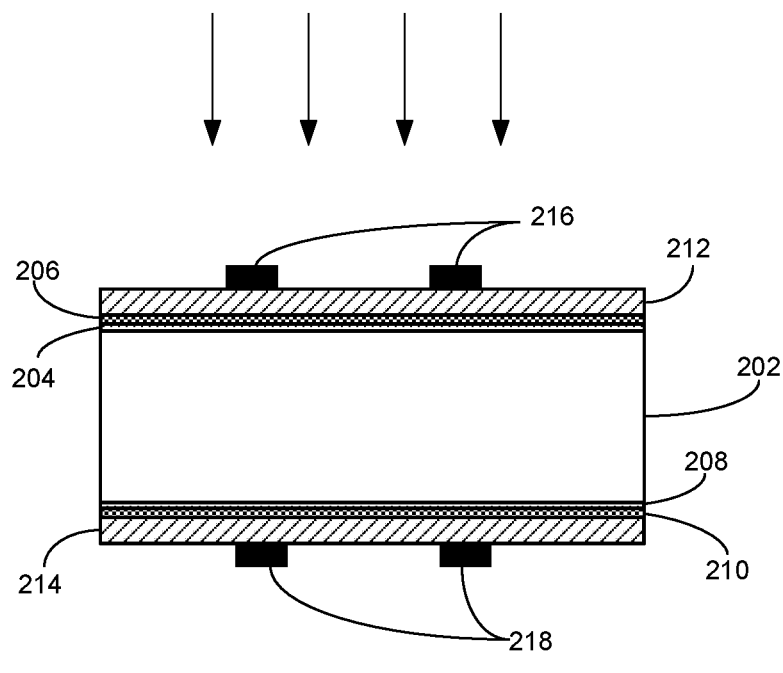
FIG. 2 shows an exemplary photovoltaic structure, according to an embodiment of the present invention.

To simultaneously obtain an interface with a low $D_{it}$ and to achieve the wide bandgap passivation, in some embodiments, the intrinsic a-Si:H passivation layer can include a bi-layer structure. FIG. 2 shows an exemplary photovoltaic structure, according to an embodiment of the present invention. In FIG. 2, photovoltaic structure 200 can include substrate 202, front passivation sub-layers 204 and 206, back passivation sub-layers 208 and 210, surface-field layer 212, emitter layer 214, and electrode grids 216 and 218.

Various layers of photovoltaic structures 200 can be similar to the corresponding layers of photovoltaic structure 100 shown in FIG. 1. For example, substrate 202 can be similar to substrate 102, surface field layer 212 can be similar to surface field layer 108, emitter layer 214 can be similar to emitter layer 110, and electrode grids 216 and 218 can be similar to electrode grids 112 and 114, respectively.

Passivation sub-layers 204 and 208 are in contact with base layer 202. As discussed previously, H-rich a-Si:H can cause increased $D_{it}$. Hence, it can be desirable for passivation sub-layers 204 and 208 to be low in H content. In some embodiments, passivation sub-layers 204 and 208 can be formed using a CVD process that does not use $H_2$ as a precursor. In one embodiment, only silane can be used as the precursor gas during the CVD processes that form passivation sub-layers 204 and 208. In one embodiment, a combination of silane and one or more inert gases (e.g., Ar) may be used during the CVD processes that form passivation sub-layers 204 and 208. In some embodiments, the thickness of passivation sub-layers 204 and 208 can be between 10 and 50 angstroms.

On the other hand, passivation sub-layers 206 and 210 are not in direct contact with base layer 202; hence, interface defects are less critical for these layers. Therefore, H-rich a-Si:H can be a better material choice for passivation sub-layers 206 and 210 due to its wider bandgap. In some embodiments, passivation sub-layers 206 and 210 can be formed using a CVD process that use both silane and $H_2$ as precursor gases. The ratio between the flow rates of silane and $H_2$ can be between 1 and 100, preferably between 1 and 30. This result in passivation sub-layers 206 and 210 to have higher H content than passivation sub-layers 204 and 208. In some embodiments, one or more inert gases (e.g., Ar) can also be vented into the CVD chamber to assist the deposition (mostly for igniting the plasma during a PECVD process). In some embodiments, the thickness of passivation sub-layers 206 and 210 can be between 20 and 100 angstroms, preferably between 50 and 70 angstroms.

Other than the passivation layers, fabrications of other layers within photovoltaic structures 100 and 200 can also involve CVD processes. For example, surface field layers 108 and 212 and emitter layers 110 and 214 can also be formed using CVD processes. When a fabrication process involves multiple sequential CVD processes, a cluster CVD tool can be used to provide efficient fabrication. A cluster CVD tool can include one or more CVD chambers, which can be coupled with a robotics module operating in a common vacuum to handle wafer transport between these chambers. Within each chamber, a wafer can be held steady (for example, placed on a stable wafer carrier) and heated. When reaction gas encounters the heated surface of the wafer, solid material is deposited from the vapor by a chemical reaction occurring on or in the vicinity of the heated surface. By varying the deposition conditions (e.g., substrate material, substrate temperature, composition of the reaction gas mixture, gas flow rates, etc.), materials with different properties can be grown. Furthermore, plasma from an inert gas can be used to enhance the deposition process. Such plasma can be generated using a radio-frequency (RF) source with an injection of an inert gas flow.

When wafers undergo a CVD process in a cluster CVD tool, the wafers are static, i.e., not moving. Wafers are processed in batches in the multiple chambers. Such static processing generally results in better film quality, because the positioning and on-off timing of the reactive gases can be controlled and potentially optimized. For example, the placement of gas flows and plasma sources can be designed to improve film uniformity across all wafers held in a stationary wafer carrier. Furthermore, the plasma can be ignited after the wafers are stable in their positions, their temperature at the desired setting, and the gas flow rates/processing pressure stabilized to ensure optimal deposition conditions.

Figure 3:
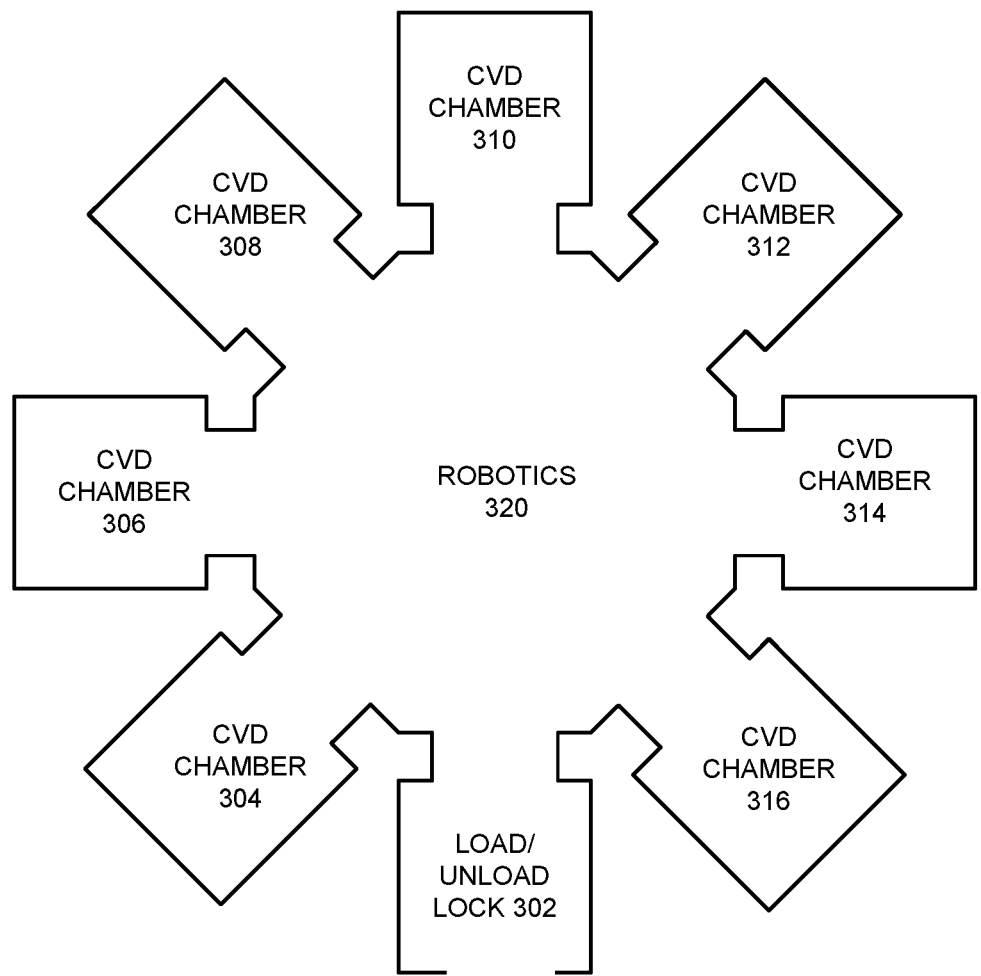
FIG. 3 shows a cluster CVD tool.

FIG. 3 shows a cluster CVD tool. In FIG. 3, cluster CVD tool 300 can include load/unload lock 302, robotics system 320, and CVD process chambers 304, 306, 308, 310, 312, 314, and 316. During operation, wafers are first loaded in load/unload lock 302, which can function as an airlock and facilitate vacuum pump-down before the wafers are transported into a CVD chamber. After the pressure in load/unload lock chamber 302 is pumped down, and optionally after the wafers have been heated to the desired temperature, robotics 320 can transport the wafers to one of the CVD chambers, such as CVD chamber 304, for film deposition. One or more of the CVD chambers can be used to deposit a number of layers. A buffer chamber can also be present between a respective CVD chamber and the center robotics system to avoid potential cross-contamination between the deposited layers. A buffer chamber can include slit valves to separate the space on both sides of the valve, such that particles on one side are prevented from diffusing to the other side.

In a large-scale production scenario, each CVD chamber in cluster CVD tool 300 can accommodate multiple Si wafers, and cluster CVD tool 300 can be configured to have independent control in each chamber to allow for simultaneous deposition in all chambers. For example, it can be possible to configure first subset of the chambers of cluster CVD tool 300 for the deposition of intrinsic a-Si layers and a second subset of chambers for the deposition of doped a-Si layers. Si wafers can be loaded into the first subset of chambers for the deposition of the intrinsic a-Si layers (the passivation layers), and then be transported, within cluster CVD tool 300, to the second subset of chambers for the deposition of a doped a-Si layer (the surface field or emitter layer). This way, a relatively large batch (e.g., tens) of Si wafers can be simultaneously processed.

Figure 4:
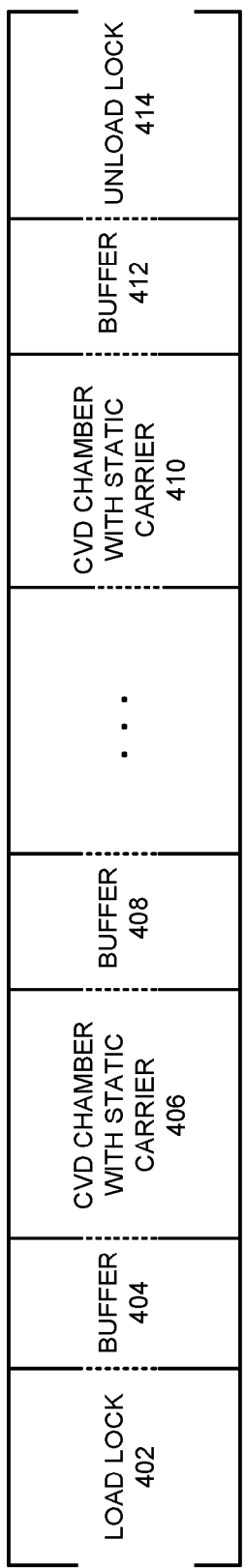
FIG. 4 shows a linear CVD tool.

In addition to arranging the multiple CVD chambers in a cluster formation, it can also be possible to arrange the multiple CVD chambers in a linear formation. FIG. 4 shows a linear CVD tool. In FIG. 4, linear CVD tool 400 can include load lock 402, a number of static CVD chambers (CVD chambers with a static carrier, e.g., chambers 406 and 410), a number of buffer chambers (e.g., buffers 404, 408, and 412), and unload lock 414. The multiple CVD chambers can allow for deposition of multiple layers, and the buffer chambers can eliminate cross-contamination between deposited layers. Each CVD chamber may accommodate multiple wafers to allow for batch processing.

During operation, wafers are first placed in load lock 402 for vacuum pump-down and optional pre-heating. Subsequently, the wafers are moved into buffer chamber 404 by, for example, a robotic or conveyor system. Next, the wafers can be sequentially moved into the multiple CVD chambers (e.g., chambers 406 and 410) with the buffer chambers (e.g., buffer 408) in between for deposition of multiple layers. Each CVD chamber can be configured independently (e.g., temperature, pressure, precursors, RF powers, etc.) based on the desired material make-up and/or film quality of the corresponding layer. During deposition, the wafers are held steady and processed in a batch. Because the CVD environment is static (i.e., the wafers are not moving), linear CVD tool 400 can produce high-quality films. After the CVD processes, the wafers are then sent into buffer chamber 412, and unload lock 414 for vacuum release and cooling, before they are taken out of linear CVD tool 400.

Although the cluster CVD tool and the linear CVD tool can allow for parallel processing of a batch of Si wafers, their capacities can be limited by the number of chambers and the size of each chamber. In addition, the entire system is static, meaning that wafers need to wait for the vacuum pumping down, the heating, the stabilization of gas pressure, the ignition of the plasma, etc. The limited chamber capacity and the required wait time can limit the overall throughput of the deposition system. In practice, large-scale manufacturing facilities of photovoltaic structures often rely on inline CVD tools for high-throughput fabrication. In an inline CVD tool, the wafers are placed on a carrier that can continuously move through a deposition chamber while radicals are deposited onto the surface of the wafers. When multiple layers are needed, the wafer carrier can also transfer the wafers from one deposition chamber to the next.

Figure 5:
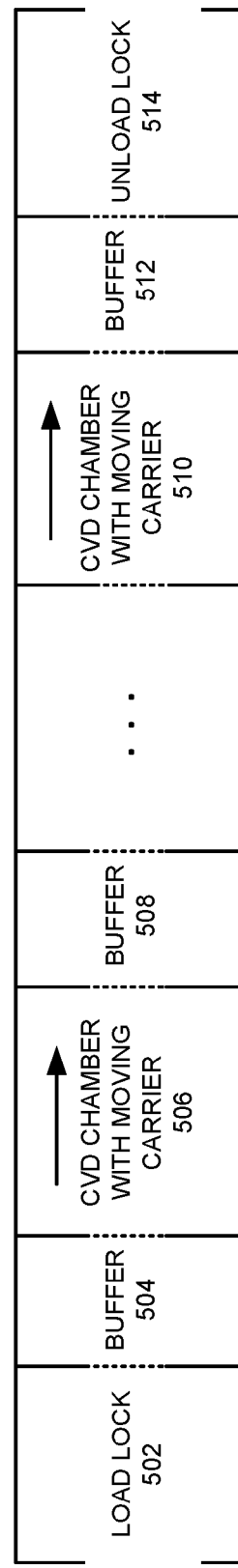
FIG. 5 shows an inline-processing CVD tool.

FIG. 5 shows an inline-processing CVD tool. In FIG. 5, inline-proces sing CVD 500 tool can include load lock chamber 502, a number of inline CVD chambers (CVD chambers with a moving carrier, e.g., chambers 506 and 510), a number of buffer chambers (e.g., buffers 504, 508, and 512), and unload lock 514. This inline system is different from the static system shown in FIG. 4 in that the CVD chambers here are inline-processing chambers, meaning that the wafer carriers are moving (as indicated by the arrow in the chamber) during the CVD process. In the inline-processing chamber, the gases (e.g., precursor gases) flow continuously and the process pressure is constantly maintained. There is no need for the wafers to wait for stabilization of the gas flow rate and process pressure. Once the wafers enter an inline-processing CVD chamber, the RF power turns on to ignite the plasma, and the wafer carrier moves through the plasma-filled chamber while the film is deposited. Inline-processing CVD tool 500 can achieve higher throughput compared to the static tools, because the wafers processed in the inline tool do not need to stop in the CVD chamber. The tradeoff, however, is that the quality of the film produced by the inline CVD tool can be less than that produced by a static CVD tool due to the non-controllable plasma conditions. More specifically, inline CVD may not be able to deposit high-quality intrinsic a-Si film that can meet the passivation requirements of a high-efficiency photovoltaic structure.

To meet the passivation requirements while maintaining high fabrication throughput, some embodiments of the present invention can provide a CVD system that can combine both a static CVD chamber and an inline CVD chamber. This way, both high film quality (provided by the static CVD process) and high production throughput (provided by the inline CVD process) can be achieved. During fabrication of many types of semiconductor devices, such as photovoltaic structures, high film quality is usually only required at certain critical layers or interfaces between layers. For example, for heterojunction photovoltaic structures, it can be critical to maintain low $D_{it}$ at the junctions, meaning that the corresponding films (e.g., the passivation sub-layer that is in contact with the base layer) should have superior film quality in terms of uniformity and defect density. Other layers (e.g., the passivation sub-layer that is not in contact with the base layer and/or the surface field/emitter layer) have less stringent quality requirements.

In some embodiments, a novel CVD system can include one or more static-processing CVD chambers combined with one or more inline-processing CVD chambers in a linear fashion. The layers with a higher film-quality requirement can be fabricated using the static-processing chamber (s), which can produce better quality films but can take longer time. The layers with a lower quality requirement can be fabricated using the inline-processing chamber(s), where the wafers continuously move through such chamber(s) to attain higher production throughput.

Figure 6:
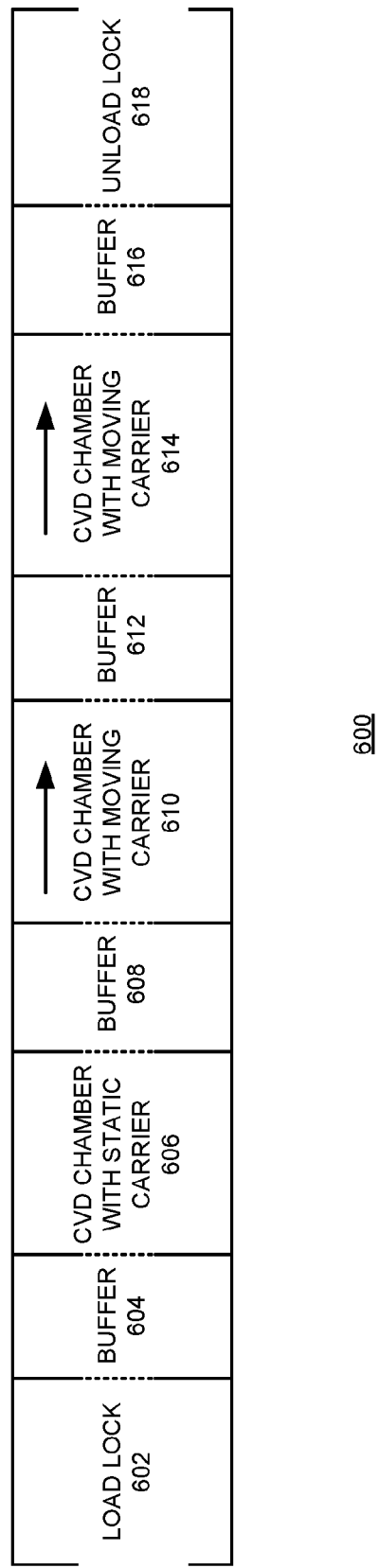
FIG. 6 shows a combined CVD tool, according to one embodiment of the present invention.

FIG. 6 shows a combined CVD tool, according to one embodiment of the present invention. In FIG. 6, combined CVD tool 600 can include load lock 402, buffer chamber 604, static CVD chamber (CVD chamber with a static carrier) 606, buffer chamber 608, inline CVD chamber (CVD chamber with a moving carrier) 610, buffer 612, inline CVD chamber 614, buffer 616, and unload lock 618. During operation, the wafers can first enter load lock 602 for vacuum pump-down and optional pre-heating. This process can be a static process. The wafers can then be moved into static CVD chamber 606 via buffer chamber 604. Static CVD chamber 606 can be configured to accommodate a wafer carrier that can hold a large number (e.g., tens or hundreds) of wafers. To reduce contamination, the wafer carrier can be a graphite or carbon fiber composite (CFC) carrier coated with a low-porosity material, such as pyrolytic carbon or silicon carbide. The wafer carrier may also include a non-flat surface or a partially carved-out structure at the bottom of the wafer-holding pockets. In static CVD chamber 606, the wafers are held steady to undergo a CVD process that can grow a high-quality film with low $D_{it}$ (e.g, a passivation layer that interfaces with the Si base layer).

After this static CVD process, the wafers can be moved into buffer chamber 608. Note that at this point another batch of wafers can be moved into static CVD chamber 606 for processing, so that a pipelined operation can be achieved.

Next, the wafers can be placed onto a moving carrier (e.g., a wafer carrier on a conveyor) and moved from buffer chamber 608 into inline CVD chamber 610, which can already have the precursor influx turned on and the pressure inside the chamber maintained to a constant value. Once the wafers enter inline CVD chamber 610, RF power will be turned on to ignite the plasma. The wafers can continue their movement, without stopping, through inline CVD chamber 610 during this stage of the CVD process, which can deposit a film layer (e.g., a passivation layer that does not directly interface with the Si base layer) onto a large number of Si wafers in a short time period. The moving speed of the wafer carrier can be configured according to the desired layer thickness. After being processed inside inline CVD chamber 610, the wafers can continue their movement into the next inline CVD chamber 614 via buffer 612 for additional inline CVD processing. The continuous movement of the wafer carrier can bring the wafers to buffer 616 and eventually unload lock 618, before they are taken out of combined CVD tool 600. For high throughput, it can be desirable to have the wafer carrier moving at a steady speed, meaning that the settings (e.g., gas flow rate, RF power, etc.) of the multiple inline chambers should be adjusted based on a common moving speed. In certain scenarios (e.g., when there is a drastic difference in film thickness), the wafer carrier may move with different speeds in different inline chambers. However, this can introduce delay between processing, and thus may reduce fabrication throughput. Note that, in general, wafers can stay inside static CVD chamber 606 for the longest amount of time in order to obtain a high-quality film; hence, this can be the "bottleneck" for the entire tool and can determine the overall system throughput.

Compared to conventional static CVD tools (e.g., a cluster CVD tool or a liner CVD too) and inline CVD tools, which only include either static-processing chambers or inline-processing chambers, but not both, this combined CVD tool is advantageous. That is, static CVD processing is only used for layers that require high film quality, whereas inline CVD processing can be used for other layers. As a result, the overall system throughput can be significantly improved without sacrificing film quality for the critical layers. Furthermore, this combined CVD tool can be used not only to deposit layers with different quality requirements, but also to deposit a single layer with varying quality requirements by depositing different portions of the same layer in different chambers (i.e., the static-processing CVD chamber and the inline-processing CVD chamber). For example, photovoltaic structures often include one or more passivation layers, and a passivation layer usually is required to have a high-quality surface near the interface with the underlying material, such as a crystalline base layer. The present combined CVD tool can be used to deposit the high-quality portion of this passivation layer in its static-processing chamber, and then deposit the rest of the passivation layer in its inline-processing chamber. Compared with a system that deposits the entire passivation layer using a static CVD tool, this configuration can effectively shorten the amount of time required to deposit the passivation layer (because the length of time the wafer spends in the static-processing CVD chamber is shortened), and overall production throughput can be increased. Compared with a system that deposits the entire passivation layer using an inline CVD tool, this configuration can provide better passivation (because a low $D_{it}$ can be achieved by the static-processing CVD chamber), and the efficiency of the produced photovoltaic structures can be enhanced.

Note that the system illustrated in FIG. 6 only shows one static-processing CVD chamber followed by two inline-processing CVD chambers. In general, any number of static-processing CVD chambers and inline-processing CVD chambers can be combined, in any order, into a single tool to meet the requirement of different layers based on a given device design. In addition, a number of static-processing CVD chambers may be configured in a cluster manner, and this cluster can be part of a larger, combined CVD tool that can include other inline-processing CVD chambers. During the entire CVD process, including depositions of the different passivation layers and any additional layers, the Si wafers remain in a common vacuum space that includes both the static-processing CVD chambers and the inline-processing CVD chambers. Because the vacuum remains unbroken in all processing chambers, wafers no longer need to wait for the pumping down of the processing chambers. This can provide higher throughput compared to a fabrication process that uses individual, segregated CVD systems for the depositions of the different layers.

Figure 7:
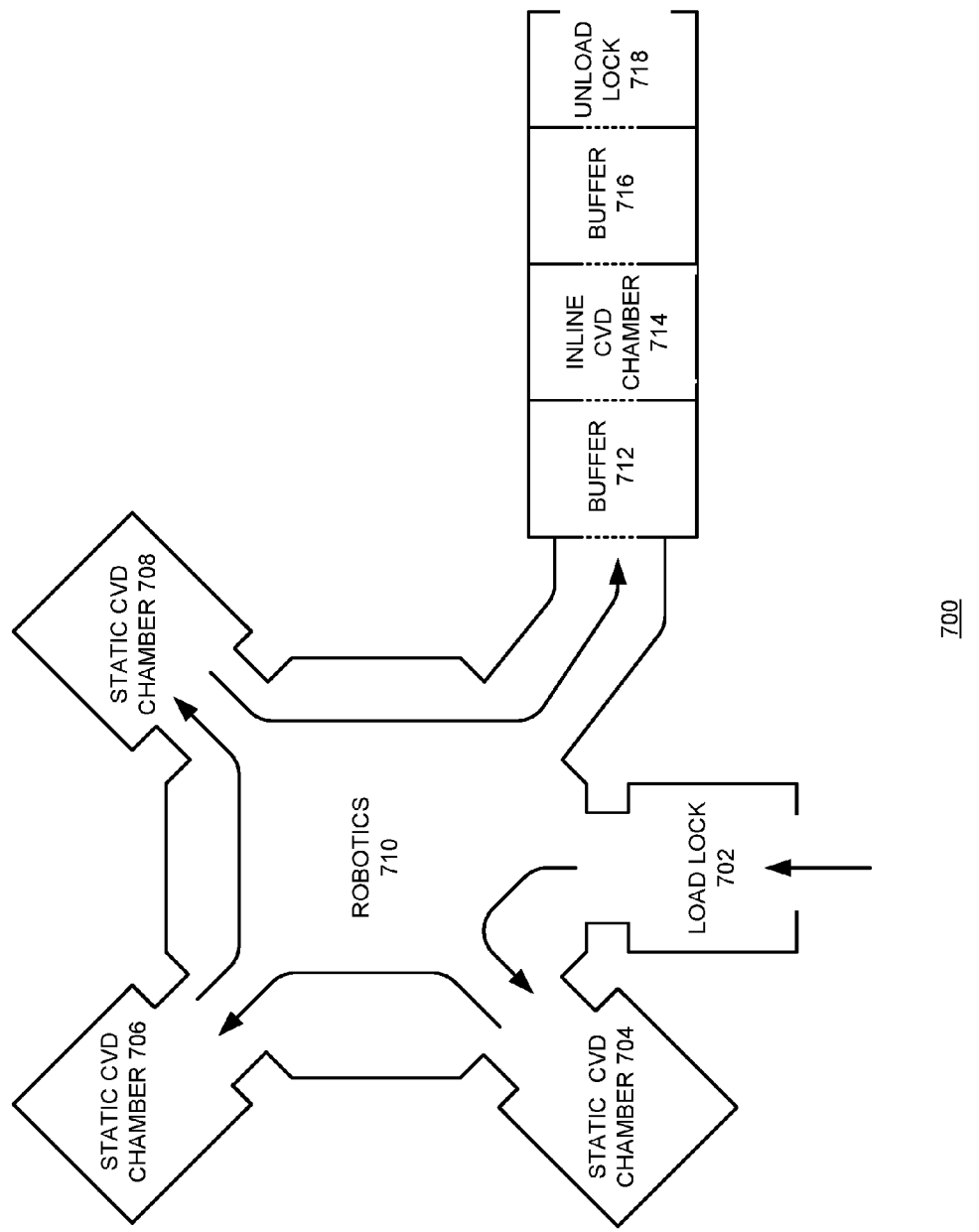
FIG. 7 shows a combined CVD tool, according to one embodiment of the present invention.

FIG. 7 shows a combined CVD tool, according to one embodiment of the present invention. In FIG. 7, combined CVD tool 700 includes a cluster portion and an inline portion. The cluster portion can include load lock 702, static CVD chambers 704, 706, and 708 configured in a cluster fashion, and robotics system 710. The cluster portion can be coupled (while maintaining the same vacuum seal) to the inline portion, which can include buffer chamber 712, inline CVD chamber 714, buffer chamber 716, and unload lock 718. The three static chambers 704, 706, and 708 can be used to fabricate multiple high-quality layers sequentially, or used in parallel to fabricate the same layer for three batches of wafers for improved throughput. In other words, if a single static CVD chamber creates a bottleneck for the entire CVD tool (as shown in FIG. 6) and slows down the overall throughput, multiple static CVD chambers can be used to alleviate the delay. These static CVD chambers can be connected in a cluster manner and operate in parallel on multiple wafer batches to match the throughput of the rest of the tool.

As illustrated in FIG. 7, static chambers 704, 706, and 708 can process three wafer batches at the same time, while the inline portion of the tool (namely inline CVD chamber 714) can process wafer batches at a higher speed. Optionally, the wafers can move continuously without stopping through the inline portion of the system (i.e., buffer 712, inline CVD chamber 714, buffer 716, and unload lock 718) for high-throughput production.

Fabrication Process

In one embodiment of the present invention, the aforementioned combined CVD system can be used to fabricate photovoltaic structures. The specific device structure described herein is only one use case for the present combined CVD system, and should not limit the application of this CVD system to only photovoltaic structure fabrication. In the example described herein, a photovoltaic structure can have a double tunneling junction structure, and can include a lightly doped (with n- or p-type dopants) crystalline silicon (c-Si) base layer. On both sides of the c-Si base layer there can be a thin dielectric (e.g., silicon oxide) layer functioning as a tunneling layer, and a first (high-quality) intrinsic a-Si layer and a second (regular quality) intrinsic a-Si layer combined to function as a passivation layer. The first (high-quality) intrinsic a-Si layer can be grown in a static-processing chamber and the second (regular quality) intrinsic a-Si layer can be grown in an inline-processing chamber. Note that the first and second a-intrinsic silicon layers may be grown using the same or different reactive gases, and may be viewed as a high-quality portion and regular-quality portion of a single layer, or viewed as two different layers. Adjacent to the passivation layers are more heavily doped n- and p-type layers as the emitter and surface field layers (which one functions as the emitter layer typically depends on the doping type of the base layer).

Figure 8:
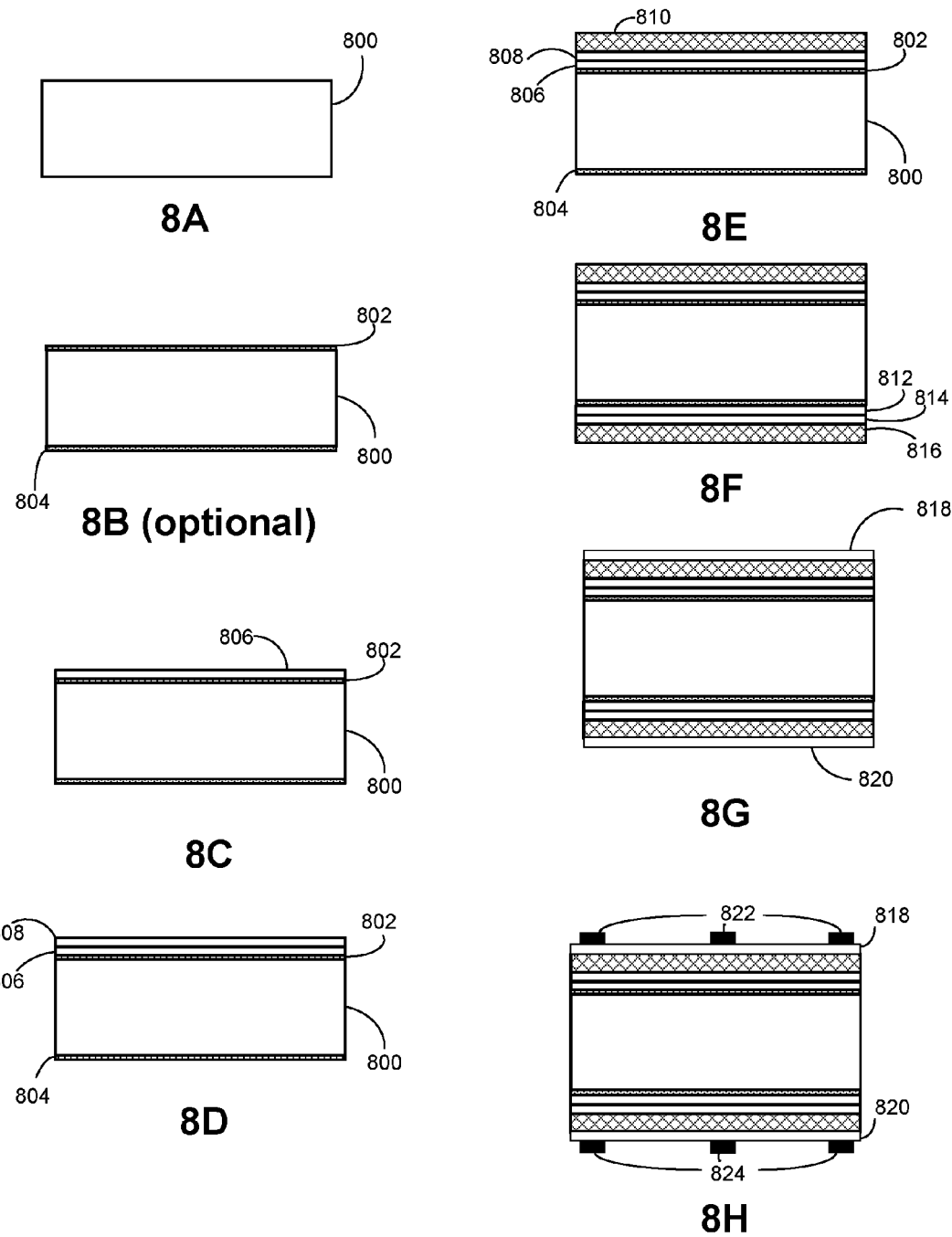
FIG. 8 shows an exemplary fabrication process of a photovoltaic structure, according to one embodiment of the present invention.

FIG. 8 shows an exemplary fabrication process of a photovoltaic structure using a CVD tool that includes both static and inline chambers, according to one embodiment of the present invention. The following process is described in conjunction with FIG. 6.

In operation 8A, substrate 800 can be prepared. In some embodiments, substrate 800 can include a solar grade Si (SG-Si) wafer, which can be epitaxially grown or prepared using a Czochralski (CZ) or Float Zone (FZ) method. The thickness of substrate 800 can be between 80 and 300 microns, preferably between 110 and 180 microns. The resistivity of the SG-Si wafer can range from 0.5 ohm-cm to 10 ohm-cm. Substrate 800 can be intrinsic or lightly doped with n- or p-type dopants. In some embodiments, substrate 800 can be doped with n-type dopants and can have a doping concentration ranging from $1 \times 10^{10}/cm^3$ to $1 \times 10^{16}/cm^3$. In further embodiments, substrate 800 can have a graded doping profile. The preparation operation can include typical saw damage etching that removes approximately 10 μm of silicon and, optionally, surface texturing. The surface texture can have various patterns, including but not limited to: hexagonal-pyramid, inverted pyramid, cylinder, cone, ring, and other irregular shapes. In one embodiment, the surface-texturing operation can result in a random pyramid textured surface. Afterwards, substrate 800 can go through extensive surface cleaning.

In optional operation 8B, a thin dielectric layer can be formed on both the front and back surfaces of Si substrate 800 to form front and back quantum tunneling barrier (QTB) layers 802 and 804, respectively. The dielectric layers can include an oxide layer, e.g, silicon oxide ($SiO_x$). Various oxidation techniques can be used to form the oxide layer, including, but not limited to: wet oxidation, dry oxidation at relatively high temperatures (around or below 400° C.) (also known as thermal oxidation), low-pressure radical oxidation, atomic layer deposition (ALD), plasma-enhanced chemical-vapor deposition (PECVD), etc. The oxide layers can also include native oxide. The thickness of dielectric layers 802 and 804 can be between 5 and 50 angstroms, preferably between 5 and 20 angstroms, and more preferably between 5 and 15 angstroms. This operation is optional, because the subsequently formed passivation layers can also function as a quantum tunneling barrier.

Next, the wafer (which has dielectric layers 802 and 804) can be placed in load lock 602 in combined CVD tool 600 illustrated in FIG. 6. After vacuum pump-down in load lock 602 to the desired setting, the wafer is then transported by a carrier to buffer chamber 604, where the wafer can pre-heated to a desired temperature. Then, in operation 8C, the wafer can be transported into static-processing CVD chamber 606 to form the first passivation layer 806. In some embodiments, silane ($SiH_4$) gas (and optionally $H_2$ gas) can be used as a precursor, and first passivation layer 806 can include intrinsic a-Si:H. To ensure low $D_{it}$, it can be desirable to have the a-Si:H in the first passivation layer 806 to have a relatively low H content. Therefore, it can be preferable not to inject $H_2$ gas into the reaction chamber during operation 8C. Note that in operation 8C the wafer can be held steady in a wafer carrier, and can remain stable during the entire CVD process. More specifically, the plasma can be turned on after the flow of the gas(es) and the chamber pressure stabilize. As a result, a high-quality, uniform intrinsic a-Si (or a-Si:H) film can be formed on dielectric layer 802. The thickness of the first passivation layer 806 can be between 10 and 50 angstroms, preferably between 20 and 40 angstroms, and more preferably between 25 and 35 angstroms, or approximately 30 angstroms.

After first passivation layer 806 is formed by the static CVD process, the wafer can be sent into inline-processing CVD chamber 610 via buffer chamber 608. At this stage (corresponding to operation 8D in FIG. 8), a second passivation layer 808 can be formed on first passivation layer 806. In some embodiments, a combination of silane and $H_2$ gases can be used as precursors, and second passivation layer 808 can include intrinsic a-Si:H. To ensure a wide bandgap of second passivation layer 808, it can be preferable to have a relatively high $H_2$ flow rate during the CVD process. In some embodiments, the ratio between the flow rates of silane and $H_2$ can be between 1 and 100, preferably between 1 and 30. This can result in second passivation layer 808 to have higher H content than first passivation layer 806. Because second passivation layer 808 is not in contact with dielectric layer 802 or substrate layer 800, the quality requirement for this second passivation layer can be less stringent. Therefore, the deposition of second passivation layer 808 can occur in an inline-processing CVD chamber where the wafer continuously moves through inline CVD chamber 610 during the CVD process. The thickness of second passivation layer 808 can be between 20 and 100 angstroms, preferably between 40 and 80 angstroms, more preferably between 50 and 70 angstroms.

The wider bandgap of second passivation layer 808 can provide better matching to the subsequently grown heavily doped a-Si layers (described below), resulting in a higher open-circuit voltage (Voc) for the photovoltaic structure. Meanwhile, the presence of the high-quality first passivation layer 806 can ensure low defect density at the junction interface, which can be critical to good passivation. The combination of high-quality first passivation layer 806, grown in static-processing CVD chamber 606, and second passivation layer 808, grown in inline-processing CVD chamber 610 can achieve high production throughput while maintaining high-quality passivation and device performance.

In operation 8E, the wafer can be sent into inline-processing CVD chamber 614, for growing a heavily doped a-Si layer 810, which can be n- or p-type doped, and can function as a surface field layer or an emitter layer. In some embodiments, heavily doped a-Si layer 810 can be n-type doped, and during operation 8E, silane, $H_2$, and phosphine ($PH_3$) can be used as precursors for the CVD process. In alternative embodiments, heavily doped a-Si layer 810 can be p-type doped, and during operation 8E, silane, $H_2$, and diborane ($B_2H_6$) can be used as precursors for the CVD process. The thickness of heavily doped a-Si layer 810 can be between 2 and 50 nm, preferably between 4 and 8 nm. The doping concentration of heavily doped a-Si layer 810 can range from $1\times10^{15}/cm^3$ to $5\times10^{20}/cm^3$. In some embodiments, heavily doped a-Si layer 810 can have a graded doping profile. More specifically, the region adjacent to second passivation layer 808 can have a lower doping concentration, and the region away from second passivation layer 808 can have a higher doping concentration. Heavily doped a-Si layer 810 can be processed in an inline CVD chamber because the film quality is less critical for heavily doped layers.

The wafer can then be taken out of the CVD tool. Optionally, the wafer can go through a wet process (e.g., being submerged in a diluted HF solution) to remove dielectric layer 804, because this layer has been contaminated by the previous CVD processes. Optionally, another fresh dielectric layer can be re-deposited. Subsequently, the wafer can be placed in a separate, similar CVD tool for fabricating a similar structure on the opposite side of base layer 800. As shown in operation 8F in FIG. 8, first passivation layer 812, second passivation layer 814, and heavily doped a-Si layer 816 (which can be p- or n-type doped, and can function as an emitter layer or a surface field layer) are grown on the opposite side of base layer 800. These layers can be grown using a combined CVD tool similar to the one illustrated in FIG. 6. Specifically, first passivation layer 812 can be grown in a static-processing CVD chamber using a process similar to operation 8C, in which silane gas or a combination of silane and $H_2$ gases can be used as precursors. Second passivation layer 814 can be grown in an inline-processing CVD chamber using a process similar to operation 8D, in which silane gas or a combination of silane and $H_2$ gases can be used as precursors. Heavily doped a-Si layer 816 can be grown in an inline-processing CVD chamber using a process similar to operation 8E.

In operation 8G, transparent conductive oxide (TCO) layers 818 and 820 are formed on heavily doped a-Si layers 810 and 816, respectively. TCO layers 818 and 820 can be formed using a physical vapor deposition (PVD) process, such as sputtering or evaporation. Materials used to form TCO layers 818 and 820 can include, but are not limited to: tungsten doped indium oxide (IWO), indium-tin-oxide (ITO), GaInO (GIO), GaInSnO (GITO), ZnInO (ZIO), ZnInSnO (ZITO), tin-oxide ($SnO_x$), aluminum doped zinc-oxide (ZnO:Al or AZO), gallium doped zinc-oxide (ZnO:Ga), and their combinations.

In operation 8H, metallic grids 822 and 824 can then be formed on TCO layers 818 and 820, respectively. In some embodiments, metallic grids 822 and 824 can include a Cu grid formed using various metallization techniques, including, but not limited to: electroless plating, electroplating, sputtering, and evaporation. In further embodiments, the Cu grid can include a Cu seed layer or a metallic adhesive layer that comprises Ti or Ta, and a electroplated bulk Cu layer. The seed layer and/or the metallic adhesive layer can be deposited onto the corresponding TCO layer using a physical vapor deposition (PVD) technique, such as sputtering and evaporation. The electroplated bulk Cu layer can be at least tens of microns thick (e.g., greater than 30 microns) to ensure low series resistivity.

In the exemplary process described above, the photovoltaic structure can also be fabricated using a combined CVD tool as the one illustrated in FIG. 7. For example, the high-quality first passivation layers (layers 802 and 812) can be fabricated in the cluster portion (static-processing CVD chambers 704-708) of combined CVD tool 700. Moreover, to improve production throughput, multiple batches of wafers can undergo this batch-processing CVD process in parallel, while the rest of the CVD tool operates in an inline fashion (e.g., having wafer carriers continuously moving through various inline chambers).

Exemplary Fabrication System

Figure 9:
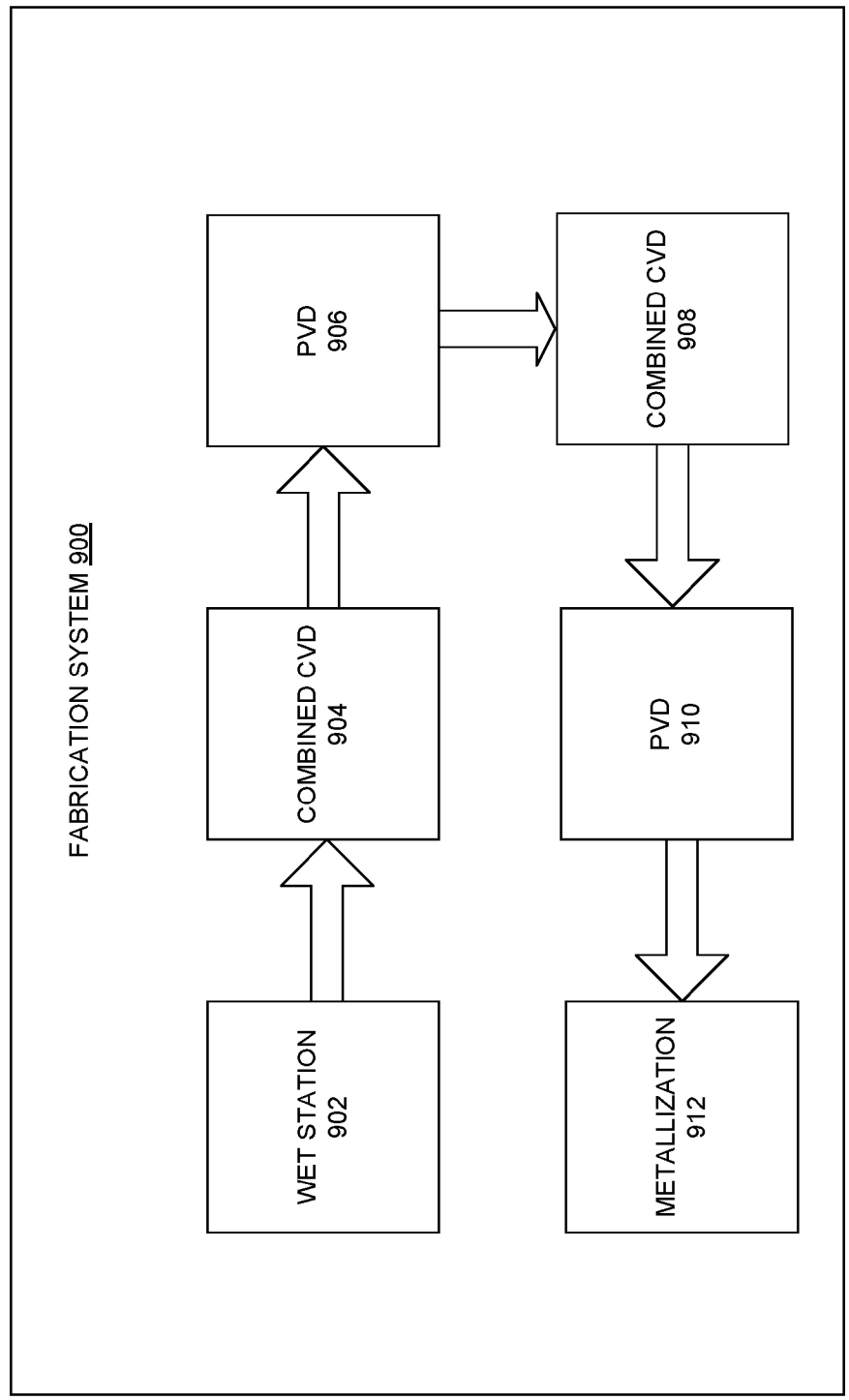
FIG. 9 shows an exemplary photovoltaic structure fabrication system, according to an embodiment of the present invention.

FIG. 9 shows an exemplary photovoltaic structure fabrication system, according to an embodiment of the present invention. In FIG. 9, fabrication system 900 can include wet station 902, combined CVD tools 904 and 908, PVD tools 906 and 910, and metallization station 912.

During fabrication, lightly doped Si wafers can go through wet station 902 for surface treatment (including cleaning, texturing, and wet oxidation). Si wafers emerging from wet station 902 can have a thin oxide layer on both sides.

The Si wafers can then be sent to combined CVD tool 904, which can include a static CVD chamber and multiple inline CVD chambers. The Si wafers are first sent to the static chamber of combined CVD tool 904 to grow a high-quality passivation film, and then sent to inline chambers to sequentially grow another passivation film of regular quality and a heavily doped a-Si layer. The high-quality passivation film can include intrinsic a-Si:H with low H content, and the passivation film of regular quality can include a-Si:H with high H content. Accordingly, the static chamber may only use silane as precursor, whereas the inline chamber may use both saline and H2 as precursors. If the original Si wafers are n-type doped, diborane (B2H6) may also be introduced to the last inline chamber of combined CVD tool 904 as a p-type dopant. Si wafers emerging from combined CVD tool 904 can have p-side passivation layers and the p-type emitter.

PVD tool 906 can be used to deposit the p-side TCO layer and/or metallic layers. In some embodiments, the p-side TCO layer can include TCO materials with a relatively high work function (e.g., between 5 and 6 eV). Si wafers emerging from PVD tool 906 can have the complete p-side layer stack.

Subsequently, the Si wafers can be sent to combined CVD tool 908 for growing the n-side passivation layers and the n-type doped surface field layer. Combined CVD tool 908 can be similar to combined CVD 904, and n-side passivation layers can be similar to p-side passivation layers. In some embodiments, phosphine (PH3) can be introduced to the last inline chamber of combined CVD tool 908 as an n-type dopant.

PVD tool 910 can be used for the deposition of the n-side TCO layer and/or metallic layers. Si wafers emerging from PVD tool 910 can have the complete p-side layer stack and n-side layer stack.

Metallization station 912 can be used for forming the metallic grids.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A method for fabricating a photovoltaic structure, comprising:
    depositing a first passivation layer on a first side of a Si substrate, which forms a base layer of the photovoltaic structure, using a static chemical vapor deposition process, wherein the static chemical vapor deposition process is performed inside a first reaction chamber;
    transferring the Si substrate from the first reaction chamber to a second reaction chamber without the Si substrate leaving a common vacuum space comprising both reaction chambers; and
    depositing a second passivation layer on the first passivation layer using an inline chemical vapor deposition process, wherein the inline chemical vapor deposition process is performed inside the second reaction chamber.

2. The method of claim 1, wherein the first passivation layer includes intrinsic hydrogenated amorphous Si having low hydrogen content.

3. The method of claim 2, wherein depositing the first passivation layer involves using silane gas as a precursor.

4. The method of claim 1, wherein the second passivation layer includes intrinsic hydrogenated amorphous Si having high hydrogen content.

5. The method of claim 4, wherein depositing the second passivation layer involves using silane gas and hydrogen gas as precursors.

6. The method of claim 1, wherein the photovoltaic structure remains stationary during the static chemical vapor deposition process.

7. The method of claim 1, wherein the Si substrate continuously moves through the second reaction chamber during the inline chemical vapor deposition process.

8. The method of claim 1, wherein the second chamber is configured to have a continuous flow of processing gases.

9. The method of claim 1, wherein the common vacuum space further comprises a buffer chamber positioned between the first reaction chamber and the second reaction chamber, wherein transferring the Si substrate from the first reaction chamber to the second reaction chamber involves placing the Si substrate into the buffer chamber prior to placing the Si substrate into the second reaction chamber.

10. The method of claim 1, wherein the Si substrate comprises a thin oxide layer on both surfaces, and wherein the thin oxide layer is formed using a wet oxidation process.

11. The method of claim 1, wherein the common vacuum space further comprises a third reaction chamber, and wherein the method further comprises:
    transferring the Si substrate from the second reaction chamber to the third reaction chamber without the Si substrate leaving the common vacuum space; and
    depositing a heavily doped amorphous Si layer on the second passivation layer using a second inline chemical vapor deposition process performed inside the third reaction chamber.

12. The method of claim 11, wherein the heavily doped amorphous Si is n-type doped, and wherein the second inline chemical vapor deposition process uses silane gas, hydrogen gas, and phosphine gas as precursors.

13. The method of claim 11, wherein the heavily doped amorphous Si is p-type doped, and wherein the second inline chemical vapor deposition process uses silane gas, hydrogen gas, and diborane gas as precursors.

* * * * *